United States Patent [19]

Henaff et al.

[11] 4,434,742
[45] Mar. 6, 1984

[54] INSTALLATION FOR DEPOSITING THIN LAYERS IN THE REACTIVE VAPOR PHASE

[76] Inventors: Louis Henaff; Michel Morel, both of Pen an Allé; Jean L. Favennec, 16, cité du Vallon - St. Quay Perros, all of 22700 Perros-Guirec, France

[21] Appl. No.: 421,434

[22] Filed: Sep. 22, 1982

[51] Int. Cl.³ .............................................. C23C 13/08
[52] U.S. Cl. .................................... 118/723; 118/725; 118/729; 118/50.1; 427/38
[58] Field of Search ............... 118/50.1, 723, 729, 118/719, 725; 427/38, 39

[56] References Cited

U.S. PATENT DOCUMENTS

| | | | |
|---|---|---|---|
| 3,282,243 | 11/1966 | Phillips, Jr. et al. | 118/725 |
| 4,123,316 | 10/1978 | Tsuchimoto | 156/643 |
| 4,151,034 | 4/1979 | Yamamoto et al. | 156/345 |
| 4,160,690 | 7/1979 | Shibagaki et al. | 156/643 |
| 4,292,342 | 9/1981 | Sarma et al. | 427/34 |

FOREIGN PATENT DOCUMENTS

| | | |
|---|---|---|
| 2951453 | 7/1980 | Fed. Rep. of Germany . |
| 2125075 | of 1972 | France . |
| 2397067 | of 1979 | France . |

OTHER PUBLICATIONS

Sarma, "Plasma Deposited Polycrystalline Silicon Films," *Solid State Technology,* vol. 4, Apr. 1980, pp. 143–146.

*Primary Examiner*—John D. Smith
*Assistant Examiner*—Bernard F. Plantz
*Attorney, Agent, or Firm*—Michael N. Meller

[57] ABSTRACT

Installation for the deposition of thin layers in the reactive vapor phase by plasma.

The installation comprises a coaxial conductor, whose core is hollow and is used for introducing gas into a chamber having a row of openings. The conductor is also used for introducing the high frequency field necessary for exciting the gas. A substrate or sample holder moves beneath the row of openings.

Application to the deposition of thin layers with a large surface.

3 Claims, 2 Drawing Figures

INSTALLATION FOR DEPOSITING THIN LAYERS IN THE REACTIVE VAPOR PHASE

BACKGROUND OF THE INVENTION

The present invention relates to an installation for depositing thin layers over a large surface in the reactive vapour phase by plasma. It is used in depositing semiconductors, insulants or metals on large substrates (several decimeters), particularly made from an insulating material (such as glass). The favoured fields of application for the invention are the production of electronic circuits, flat display screens or solar cells.

The basic technology used in the invention is known. It consists of the decomposition of a gas acting as a carrier for an element to be deposited, by the action of a plasma produced by a high frequency field. This method falls within the scope of the deposition process in the reactive gaseous phase, known as chemical vapour deposition or CVD. Compared with the CVD process in which the gas is decomposed by heating it, the use of a plasma has the advantage of leading to a relatively low operating temperature (below 600° C.), which makes it possible to use inexpensive substrates such as glass.

The hitherto known plasma CVD installations do not make it possible to obtain large surface layers with a good homogeneity.

BRIEF SUMMARY OF THE INVENTION

The object of the present invention is to obviate this disadvantage. For this purpose, according to the invention, the gas introduction, distribution and excitation means are brought together in one and the same structure called the deposition head, which makes it possible to obtain a homogeneous deposit along a segment of considerable length. In addition, a relative displacement of the substrate to be covered with respect to the deposition head is possible, so that large surface layers can be obtained by sweeping the substrate.

More specifically, the invention relates to an installation for depositing layers in the reactive vapour phase, comprising in per se known manner a tightly sealed enclosure, means for introducing into said enclosure a gas of appropriate composition, means for introducing into the same enclosure a high frequency field able to form a plasma, and a sample holder, wherein the means for introducing the gas and high frequency field are brought together in a head comprising a coaxial conductor able to propagate the high frequency field, the conductor entering the enclosure by a tight passage and being constituted by an external sheath and an inner core, the latter being connected to gas supply means and issuing into a chamber having in its lower part openings regularly distributed along a rectilinear segment, the sample holder being positioned beneath the openings of the chamber and in the vicinity of the latter, the outer sheath of the conductor being connected to a metal skirt surrounding said chamber, whilst means are providing for permitting a relative displacement of the sample holder with respect to the head in a direction perpendicular to the segment with the openings.

BRIEF DESCRIPTION OF THE DRAWINGS

The invention is described in greater detail hereinafter relative to non-limitative embodiments and the attached drawings, wherein show.

DETAILED DESCRIPTION OF THE PREFERRED EMBODIMENTS

Figure 1:
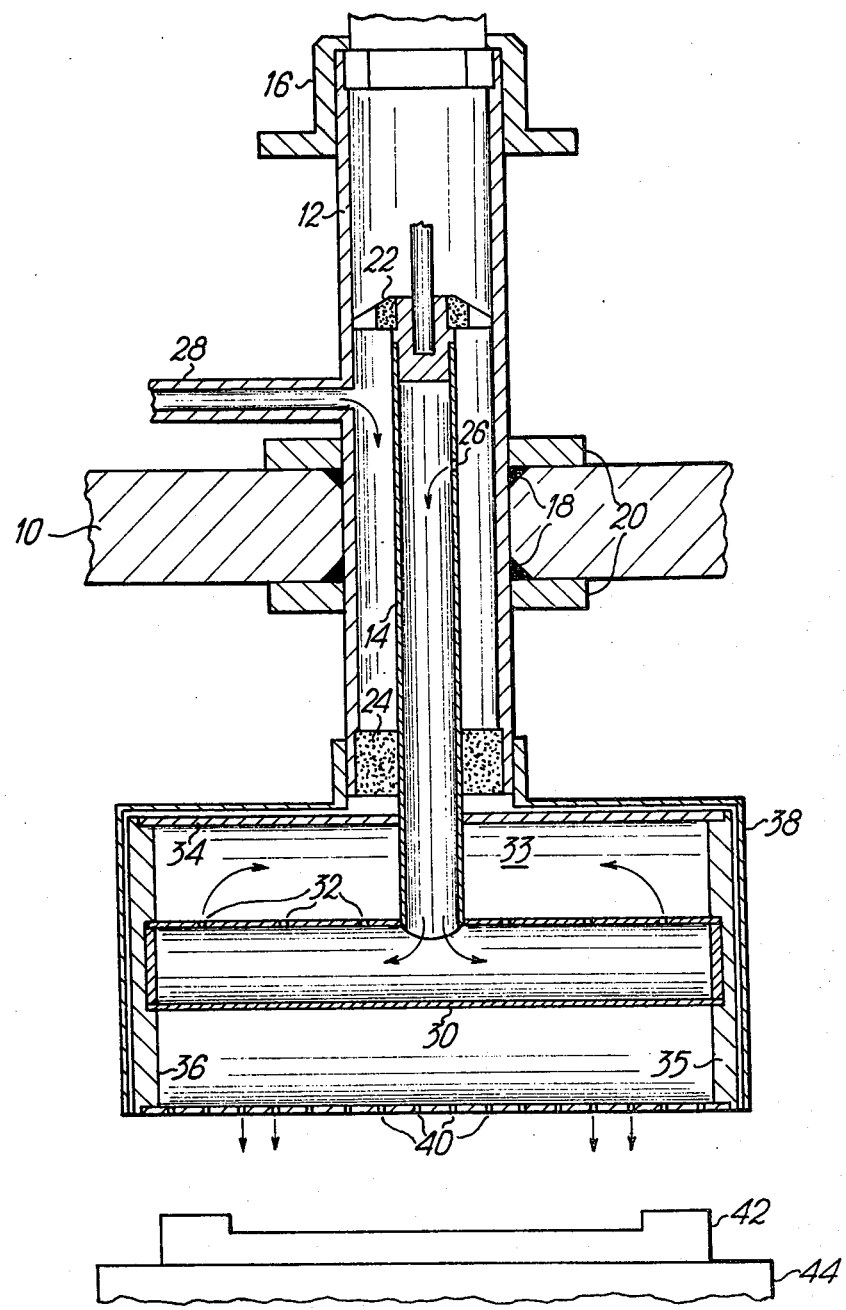
FIG. 1 in cross-section, the essential means of the invention.

FIG. 1 shows in section a vacuum enclosure defined by a tightly sealed wall 10, a coaxial conductor comprising an outer sheath 12 and an inner core 14, whereby the conductor is provided at its upper end with a connecting plug 16, which can be connected to a coaxial lead, which is itself connected to a not shown high frequency source. The coaxial conductor passes through wall 10 by a tight passage essentially formed by joints 18 secured by clamps 20. Core 14 is held in sheath 12 by insulating rings 22, 24. Moreover, the hollow core is provided with a hole 26 by which its inner volume is connected to the annular volume defined by the two conductors. A gas can be introduced into the annular volume by pipe 28.

A tube 30 with openings 32 is connected to the lower end of core 14. The tube is located in a chamber 33 delimited by a metal cylinder 34 closed by two metal end covers 35, 36. In its lower part and along one of its generatrixes, the cylinder has a row of openings 40 regularly distributed along a rectilinear segment, which extends from one end cover to the other. The openings 26, 32 and 40 can be obtained by electroerosion. A metal skirt 38 surrounds cylinder 34 and is electrically connected to sheath 12.

The installation also comprises a sample holder 42, which is positioned beneath cylinder 33 and in the immediate vicinity thereof. This sample holder is integral with a means 44 permitting its displacement in a direction perpendicular to the row of openings 40 i.e. in a direction perpendicular to the plane of FIG. 1.

The installation operates in the following way. The gas is introduced by pipe 28, enters core 14 by opening 26, then reaches tube 30, from where it is uniformly distributed within chamber 33 by openings 32. This gas then escapes by openings 40 in the direction of the sample holder. The gas can be silane ($SiH_4$) for the purpose of depositing silicon. In order to obtain $SiO_2$, an oxygen carrier gas is supplied to the silane, an example being $N_2O$. The high frequency excitation field propagates in a coaxial conductor and is emitted in the volume defined by skirt 38, cylinder 33 and end covers 35, 36. A plasma is then produced all along the segment carrying openings 40. The gas is decomposed in this area and deposition takes place all along the segment. By displacing the substrate, the latter receives a large surface homogeneous deposit.

Figure 2:
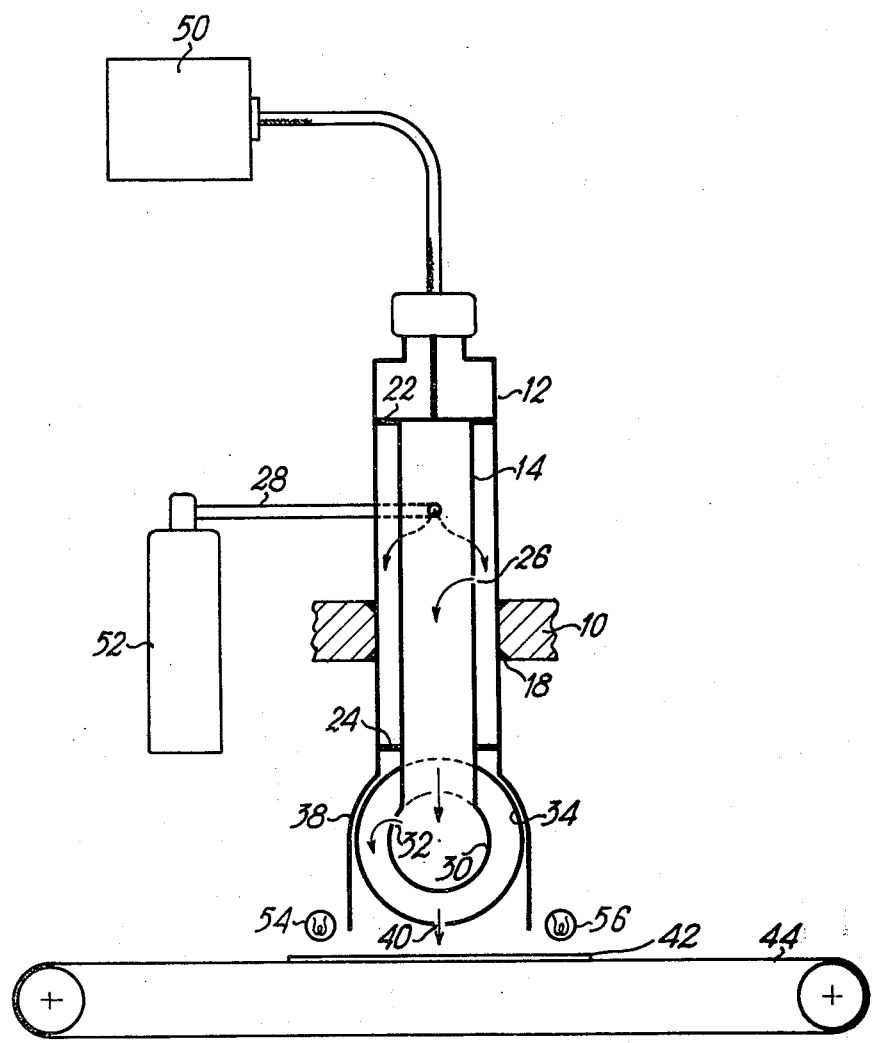
FIG. 2 a general diagrammatic side view of the installation.

FIG. 2 is a general diagrammatic view of an installation according to the invention viewed from the side. The displacement direction of the substrate is then in the plane of the drawing. Compared with FIG. 1, FIG. 2 also shows the high frequency generator 50, operating e.g. at 27 MHz, and a gas source 52. It is also possible to see two tubular infrared lamps 54, 56 arranged along skirt 38 of the head in a direction parallel to the segment along which are distributed the openings 40. These lamps heat the substrate to an appropriate temperature during deposition. Naturally, these lamps are not obligatory.

It is obvious that the shapes of the gas distribution chamber and of the skirt surrounding it have only been represented in exemplified manner and any other shape could be used.

What is claimed is:

1. An installation for the deposition of thin layers in reactive vapour phase, comprising a tightly sealed enclosure, means for introducing into the enclosure a gas having an appropriate composition, means for introducing into the same enclosure a high frequency field able to form a plasma, and a sample holder, the gas and high frequency introduction means being brought together in a head comprising a coaxial conductor able to propagate the high frequency field, said conductor entering the enclosure by a tight passage and being constituted by an outer sheath and a hollow inner core connected to gas supply means, further comprising a chamber constituted by a cylinder having openings along one generatrix, said cylinder being closed by two end covers, the core being linked with the chamber by a gas distribution tube located within the cylinder, the outer sheath of the conductor being connected to a metal skirt surrounding the chamber, whilst the sample holder is positioned beneath the row of openings, and wherein means are provided to permit a relative displacement of the sample holder with respect to the head in a direction perpendicular to the row of openings.

2. An installation according to claim 1, wherein the means for supplying gas to the hollow core comprise a pipe entering the outer sheath and an opening made in the wall defining the core.

3. An installation according to claim 1, wherein it also comprises at least one tubular infrared lamp positioned outside the head, along the skirt and parallel to the row of openings.

* * * * *